United States Patent
Zhang et al.

(10) Patent No.: US 9,385,177 B2
(45) Date of Patent: Jul. 5, 2016

(54) TECHNIQUE FOR FABRICATION OF MICROELECTRONIC CAPACITORS AND RESISTORS

(71) Applicants: STMicroelectronics, Inc., Coppell, TX (US); International Business Machines Corporation, Armonk, NY (US)

(72) Inventors: John H. Zhang, Altamont, NY (US); Lawrence A. Clevenger, LaGrangeville, NY (US); Carl Radens, LaGrangeville, NY (US); Yiheng Xu, Hopewell Junction, NY (US); Edem Wornyo, Danbury, CT (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 86 days.

(21) Appl. No.: 14/068,198

(22) Filed: Oct. 31, 2013

(65) Prior Publication Data

US 2015/0115401 A1 Apr. 30, 2015

(51) Int. Cl.
*H01L 49/02* (2006.01)
*H01L 23/525* (2006.01)
*H01L 27/01* (2006.01)
*H01L 21/3105* (2006.01)
*H01L 23/522* (2006.01)
*H01L 21/321* (2006.01)

(52) U.S. Cl.
CPC ............ *H01L 28/20* (2013.01); *H01L 23/5252* (2013.01); *H01L 23/5256* (2013.01); *H01L 27/016* (2013.01); *H01L 28/90* (2013.01); H01L 21/31053 (2013.01); H01L 21/3212 (2013.01); H01L 23/5223 (2013.01); H01L 23/5228 (2013.01); H01L 2924/0002 (2013.01)

(58) Field of Classification Search
CPC ............ H01L 23/5256; H01L 23/5252; H01L 27/101; H01L 27/2481; H01L 28/20; H01L 21/76224; H01L 21/76229; H01L 23/5223; H01L 23/5228; H01L 27/10814
USPC ........... 257/E27.071, E23.149, E27.088, 306, 257/529, 530; 438/382, 600
See application file for complete search history.

(56) References Cited

U.S. PATENT DOCUMENTS

2007/0264820 A1* 11/2007 Liu et al. ........................ 438/624
2013/0052785 A1* 2/2013 Mashiko et al. .............. 438/381

OTHER PUBLICATIONS

Zhang et al., "Modular Fuses and Antifuses for Integrated Circuits," U.S. Appl. No. 13/931,692, filed Jun. 28, 2013, 58 pages.

*Primary Examiner* — David Vu
*Assistant Examiner* — Jonathan Han
(74) *Attorney, Agent, or Firm* — Seed IP Law Group PLLC

(57) ABSTRACT

A sequence of semiconductor processing steps permits formation of both vertical and horizontal nanometer-scale serpentine resistors and parallel plate capacitors within a common structure. The method of fabricating such a structure cleverly takes advantage of a CMP process non-uniformity in which the CMP polish rate of an insulating material varies according to a certain underlying topography. By establishing such topography underneath a layer of the insulating material, different film thicknesses of the insulator can be created in different areas by leveraging differential polish rates, thereby avoiding the use of a lithography mask. In one embodiment, a plurality of resistors and capacitors can be formed as a compact integrated structure within a common dielectric block, using a process that requires only two mask layers. The resistors and capacitors thus formed as a set of integrated circuit elements are suitable for use as microelectronic fuses and antifuses, respectively, to protect underlying microelectronic circuits.

13 Claims, 8 Drawing Sheets

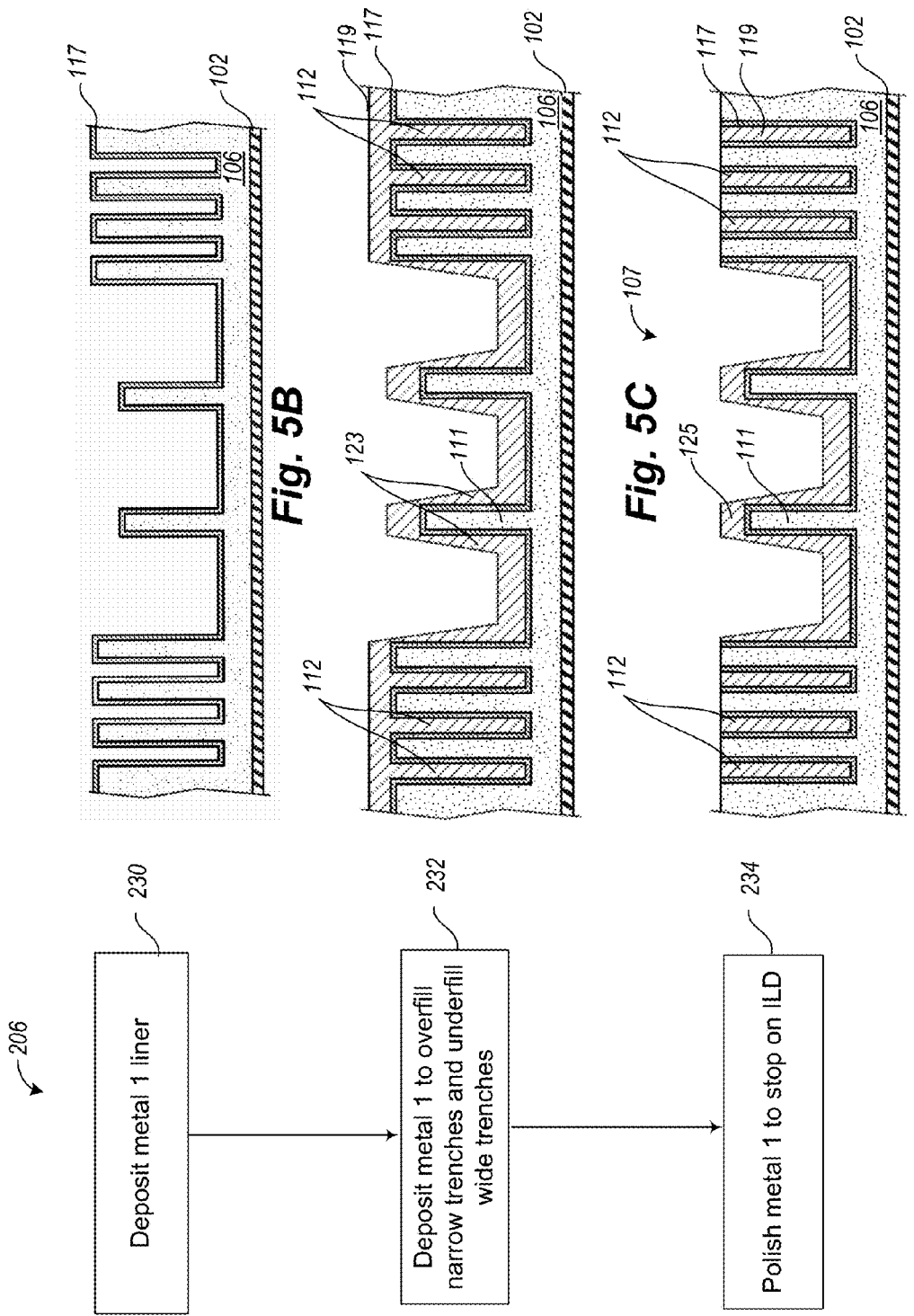

TECHNIQUE FOR FABRICATION OF MICROELECTRONIC CAPACITORS AND RESISTORS

BACKGROUND

1. Technical Field

The present disclosure relates to fabrication techniques for forming parallel plate capacitors and metal serpentine resistors together using the same sequence of processing steps. The fabrication techniques include various methods of forming inlaid metal features of disparate widths.

2. Description of the Related Art

Integrated circuits often include circuit components such as serpentine resistors and parallel plate capacitors that are made by integrating metal features with insulator structures. Electrical parameters associated with the capacitors and resistors depend on their geometry and on the material parameters of the metal and the dielectric.

Integrated circuit capacitors can be formed in a horizontal or a vertical orientation. FIG. 1A shows a perspective view of a partially formed parallel plate capacitor array 100 in a vertical orientation. Formation of the parallel plate capacitor array 100 on a semiconductor substrate 102 entails creating high aspect ratio trenches 104 in a dielectric block 106 to form very thin dielectric layers 101. The high aspect ratio trenches 104 are then filled with metal to form capacitor plates. The parallel plate capacitor array 100 can also be used as a microelectronic antifuse to protect other circuit components as described in a related U.S. patent application Ser. No. 13/931,692, entitled, "Modular Fuses and Antifuses in Integrated Circuits."

FIG. 1B shows a top plan view of a type of resistor design, a metal serpentine resistor 110. The metal serpentine resistor 110 includes a single, continuous resistor line in a serpentine shape. It can also be thought of as an array of thin parallel wires 112, that are alternately coupled at each end. The top plan view of the metal serpentine resistor 110 shown in FIG. 1B shows an end view of the array of thin wires 112, which extend into to the page. The metal wires are incorporated into a block of non-conducting material such as the dielectric block 106. The metal serpentine resistor 110 can be made in one mask step using a serpentine-shaped mask, which is the preferred method. Alternatively, a serpentine structure can be made in two separate steps by first forming an array of parallel wires, and later connecting adjacent wires alternately at the ends. The metal serpentine resistor 110 can also be used as a microelectronic fuse to protect other circuit components, as described in the related U.S. patent application Ser. No. 13/931692, entitled, "Modular Fuses and Antifuses in Integrated Circuits."

The metal serpentine resistor 110 and the vertically oriented parallel plate capacitor array 100 share a similar basic structure in which metal planes alternate with insulating planes. However, the metal planes in the parallel plate capacitor array 100 are shorter and wider, whereas the metal planes of the metal serpentine resistor 110 are narrower and taller. Because the two structures contain such features that vary considerably in their volume and surface areas, fabricating the metal serpentine resistor 110 and the parallel plate capacitor array 100 together would entail executing processes that are generally considered to be incompatible according to conventional methods. In other words, the two structures present disparate features to various semiconductor processing operations and therefore separate masks and process steps are carried out for each. Such disparate structures generally do not respond in the same way to a particular deposition, etching, or polishing treatment. For example, chemical-mechanical planarization (CMP) treatments tend to preferentially gouge the surface of large fields of metal, causing surface erosion and "dishing" which does not occur when smaller areas of metal are exposed. In another example, metal deposition processes tend to overfill narrow trenches while only partially filling wide trenches, causing an irregular surface height, referred to as non-uniform topography.

Generally, non-uniform topography is considered to be problematic. Non-uniform topography may occur on any of three different scales: wafer scale, die scale, and feature scale. For example, wafer-scale topography variation results from radial variation in the CMP process, from the center of a semiconductor wafer to the edge of the wafer. Wafer-scale topography variation can be addressed by adjusting CMP equipment parameters or materials used in the CMP process itself. Die-scale variation depends primarily on the pattern density of circuit features, which is largely determined by circuit mask designs. Wafer-scale and die-scale variation can be compensated for in a lithography scanner through focus-level adjustment by measuring wafer surface heights before each exposure. Today, optical or mechanical detection of long-range wafer surface height variation and focus adjustment is possible in most advanced lithography systems.

Feature-scale topography variation, however, is dependent on individual line widths, line spaces, or feature shapes, and cannot be compensated for in a lithography step because the variation is within an individual exposure field. Thus, non-uniform topography at the feature level poses a critical challenge for process developers as feature sizes continue to shrink. Reducing feature-scale non-uniformities for advanced technology generations is therefore of considerable interest to semiconductor technologists.

To avoid generating non-uniform topography, a typical solution to the problem of processing disparate features is to process them separately, i.e., first mask the narrow features while processing the wide features, and then mask the wide features while processing the narrow features. In addition, at smaller geometries, structures that could be built at the larger geometries no longer operate. For these and other reasons, such structures are generally formed in separate mask layers. However, adding masking layers to a production line is also best avoided, because each masking layer significantly increases the cost of the overall manufacturing process. For example, at smaller geometries under 45 nm, the cost of a single reticle to make a mask might be very expensive, so the ability to carry out a series of process steps with fewer reticles allows a great savings in chip production.

BRIEF SUMMARY

A sequence of processing steps presented herein permits formation of both vertical and horizontal nanometer-scale serpentine resistors and parallel plate capacitors together in the same fabrication process. The process cleverly takes advantage of a CMP process non-uniformity in which the CMP polish rate of an insulating material varies according to a certain underlying topography. By establishing such topography underneath a layer of the insulating material, different film thicknesses of the insulator can be created in different areas by leveraging differential polish rates, thereby avoiding the use of a lithography mask. In one embodiment, a plurality of serpentine resistors and parallel plate capacitors can be formed as a compact integrated structure within a common dielectric block, using a process that requires no more than two mask layers. The resistors and capacitors thus formed as a set of integrated circuit elements are suitable for use as microelectronic fuses and antifuses, respectively, to protect underlying microelectronic circuits.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 5A is a detailed process flow diagram showing a sequence of process steps that can be used to create horizontal and vertical serpentine resistors in a dielectric block.

FIGS. 5B-5D are cross-sectional views of profiles formed by each of the process steps shown FIG. 5A.

DETAILED DESCRIPTION

Figure 1A:
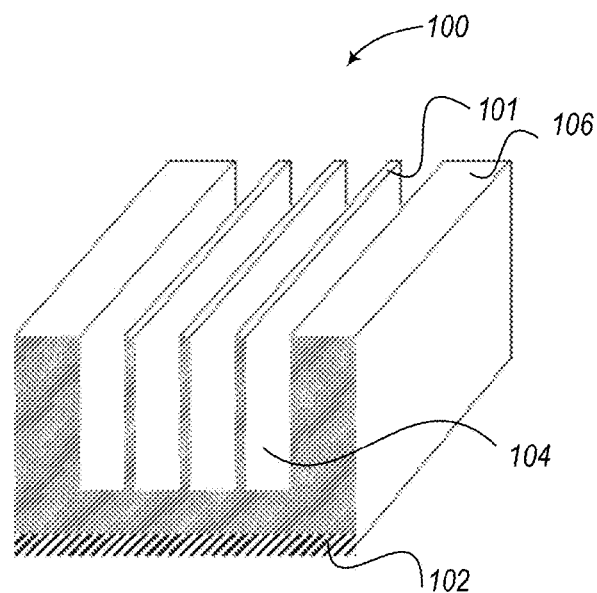
FIG. 1A is a perspective end view of a prior art damascene capacitor array that can be used as an antifuse to protect integrated circuit components.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, such as a silicon nitride hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample. Etching steps may include a post-etch clean.

Specific embodiments are described herein with reference to planarized metal interconnect structures that have been produced; however, the present disclosure and the reference to certain materials, dimensions, and the details and ordering of processing steps are exemplary and should not be limited to those shown. The terms "planarize" and "polish" are used synonymously throughout the specification. CMP steps may include a post-CMP clean.

In the figures, identical reference numbers identify similar features or elements. The sizes and relative positions of the features in the figures are not necessarily drawn to scale.

FIG. 1A shows a partially formed conventional damascene parallel plate capacitor array 100. The damascene parallel plate capacitor array 100 includes parallel dielectric layers 101, formed in a vertical orientation on a substrate 102. One advantage of such a vertical orientation is that the damascene capacitor array 100 consumes significantly less real estate on the substrate 102 than would a capacitor formed in a horizontal orientation. According to the prior art, the damascene capacitor array 100 is formed by removing dielectric material from a dielectric block 106 to form trenches 108, and filling the trenches 108 with metal to form electrodes. Very thin dielectric layers 101 that will break down at a low voltage are needed to protect low power microelectronic devices when the damascene capacitor array 100 is used as an antifuse.

Figure 1B:
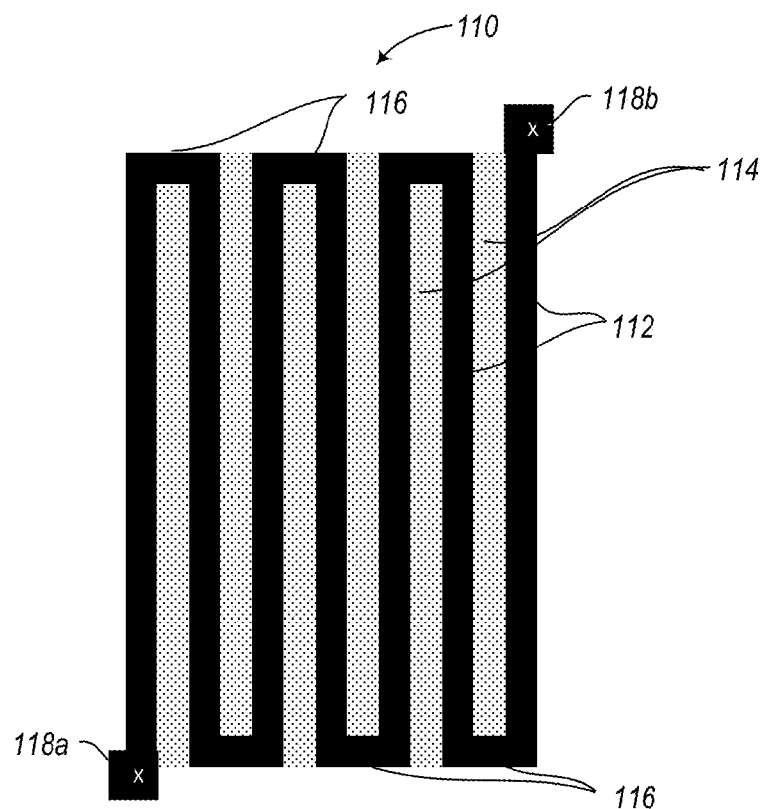
FIG. 1B is a top plan view of a prior art serpentine resistor that can be used as a fuse to protect integrated circuit components.

FIG. 1B shows a top plan view of a conventional metal serpentine resistor 110. According to the prior art, the metal serpentine resistor 110 is formed by forming an array of thin wires 112 interstitially between rows of insulating columns 114 that extend in a direction perpendicular to the plane of the serpentine structure shown. The array of thin wires 112 is then connected by links 116. A length of the metal serpentine resistor 110 between two resistor contact pads 118a and 118b determines, in part, a resistance of the resulting fuse. For example, the length of the metal serpentine resistor 110 can be halved by altering a mask pattern to join the two central rows of insulating columns 114 and links 116, and placing extra contact pads. The number of thin wires 112 and rows of insulating columns 114 can be varied to form a shorter or longer metal serpentine resistor 110.

Similarities in the structures of the metal serpentine resistor 110 and the damascene capacitor array 100 suggest that these two types of microelectronic components could be manufactured together and incorporated into a common dielectric block.

Figures 2A, 2B:
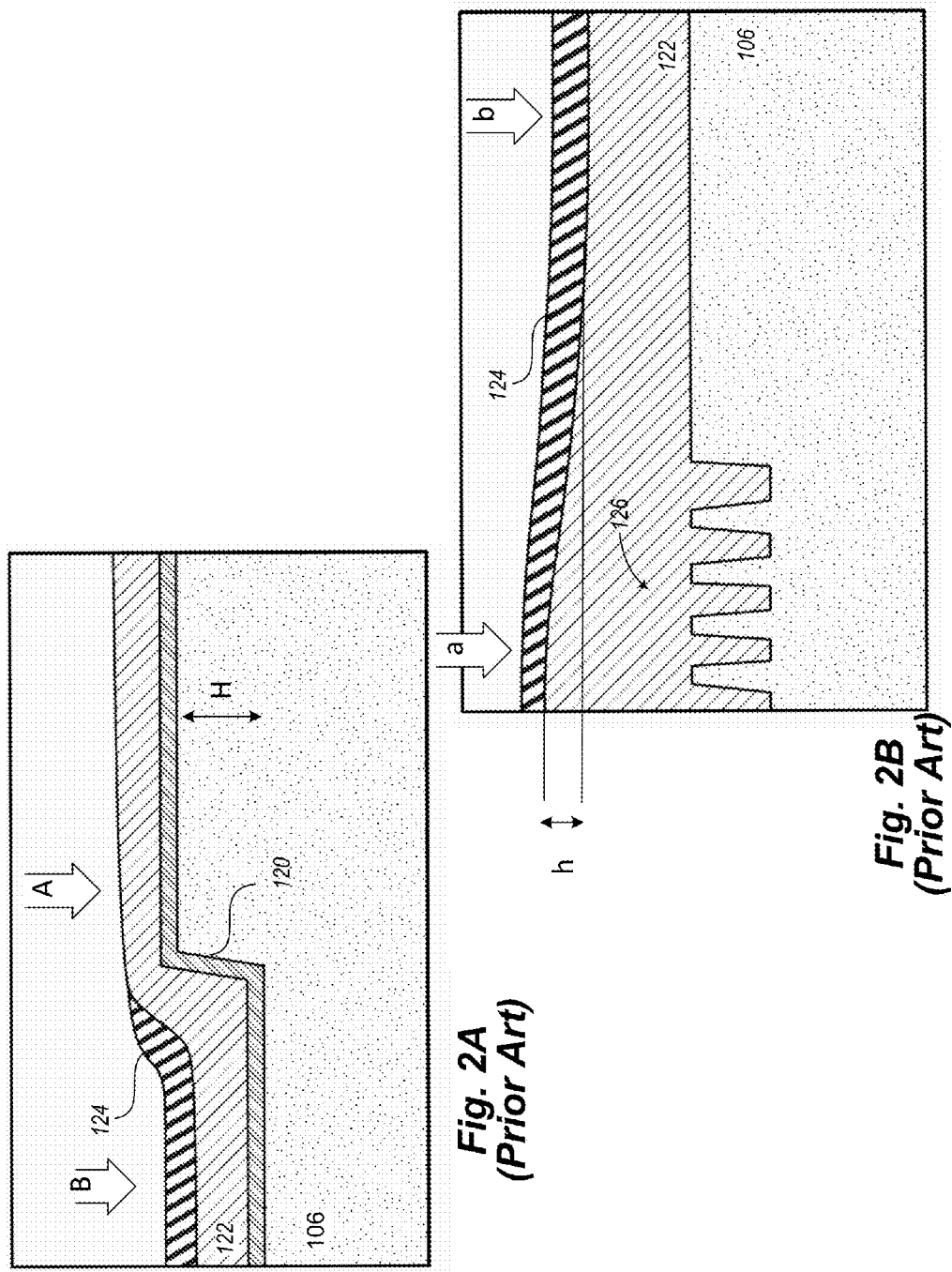
FIG. 2A is a cross-sectional image derived from an actual micrograph, showing the effect of a local non-uniformity on the insulator polish rate, for a first selected wafer structure
FIG. 2B is a cross-sectional image derived from an actual micrograph, showing a minimal effect of a global non-uniformity on the insulator polish rate for a second selected wafer structure.

With reference to FIGS. 2A and 2B, it is observed that, during a CMP process, a spatially non-uniform removal rate of an insulator such as, for example, $SiC_xN_y$, depends more on local topography than on global planarity. FIG. 2A shows a portion of the dielectric block 106 that has been patterned with an abrupt step 120 of height H. A partial metal layer 122 has been conformally deposited over the step 120. Above the metal layer 122, an insulator 124 has been deposited and planarized using CMP with a slurry made of silica and hydrogen peroxide ($H_2O_2$). It is observed that, on top of the step 120 (A), the insulator 124 is fully removed, while a significant amount of the insulator 124 still remains below the step 120 (B). Since both areas were polished for a fixed amount of time, it is concluded that the removal rate is faster on top of the step, at A, than below the step, at B.

FIG. 2B shows a different portion of the dielectric block 106 that has been patterned with a series of narrow trenches 126. The metal layer 122 has over-filled the trenches 126, resulting in a low, gradual step of height h. Above the metal layer 122, the planarized insulator 124 has a substantially even thickness, which indicates that the removal rate is about the same at a and at b, on either side of the step height h.

A comparison of the results shown in FIGS. 2A and 2B demonstrates that the polish rate of a CMP process generally exhibits a non-uniformity based on local changes in topography. The present inventors have recognized that such differences in the CMP removal rate of different types of structures permit preferentially treating certain structures and not others, without the use of a mask. This property is exploited to great advantage by the scheme described herein.

Figure 3:
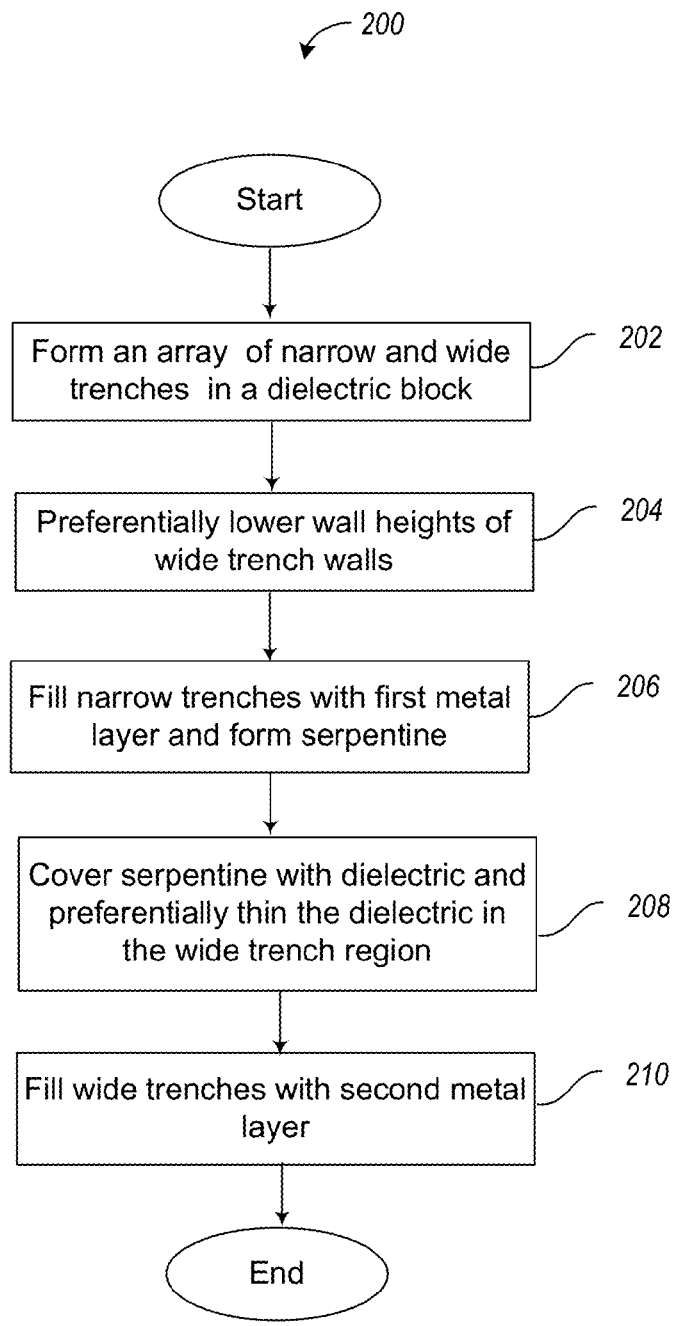
FIG. 3 is a high-level process flow diagram showing a sequence of process steps in a method that is used to make an integrated electronic structure that includes a plurality of resistors and capacitors, according to one embodiment described herein.

FIG. 3 shows general steps in a method 200 that can be used to fabricate a plurality of both horizontally and vertically oriented parallel plate capacitors and a plurality of serpentine resistors simultaneously using the same process, according to one embodiment.

At 202, a dielectric block is formed on a substrate and an array of narrow and wide trenches are patterned in the dielectric block.

At 204, wall heights of the wide trenches are preferentially lowered with respect to wall heights of the narrow trenches.

At 206, a first metal layer is deposited into the array, thereby partially filling the wide trenches while over-filling the narrow trenches.

At 208, The first metal layer is covered with a dielectric material, and the dielectric is preferentially thinned in the wide trench region.

At 210, and a second metal layer is deposited to form a capacitive structure in the wide trenches.

FIGS. 5A-5D show and describe the process steps 202 and 204 in further detail. With reference to FIG. 5A, an exemplary sequence of operations included in the process steps 202 and 204 is used to form an integrated electronic structure 107 of dielectric columns having disparate widths and heights.

At 212, the thick dielectric block 106 is formed by depositing an ultra-low-k (ULK) dielectric on the substrate 102, as shown in FIG. 5B.

The substrate 102 may be capped with a layer 106 of, for example, silicon carbide nitride ($SiC_xN_y$) having a thickness within the range of about 10-20 nm. The substrate 102 can be simply a semiconductor substrate such as silicon. Or, the substrate 102 can be a structure containing already-formed transistors and/or already-formed interconnects over which it is desired to build capacitors and resistors for use as antifuses and fuses, respectively. Accordingly, the capacitors and resistors can be used to protect underlying integrated circuit components in the substrate 102. Thus, the term "substrate" as used herein is meant in the broad sense of a layer of material over or in which subsequent processing takes place.

An ultra-low-k (ULK) dielectric material is often used as an inter-layer dielectric between metal lines used to interconnect active devices in an integrated circuit. The ULK layer used as the thick dielectric block 106 described herein has a dielectric constant k within the range of about 2.0-3.0 and a targeted thickness of about 350-450 nm.

At 214, narrow trenches 108n and wide trenches 108w are patterned in the thick dielectric block 106 by conventional lithography and reactive ion etching (RIE) processes. Patterning the ULK generally produces the narrow trenches 108n and wide trenches 108w in close proximity to one another within a common die. In one embodiment, the depth of the trenches 109 is in the range of about 100-200 nm so that the narrow trenches 108n have a high aspect ratio in the range of about 5:1 to about 10:1. The narrow trenches are patterned with a center-center spacing, or pitch, of about 32 nm or less.

At 216, wall heights of isolated insulating columns 111 remaining between the wide trenches 108w are preferentially lowered with respect to the wall heights of non-isolated insulating columns 114 remaining between the narrow trenches 108*n*. In one embodiment, this can be achieved by masking the non-isolated insulating columns 114 and performing a touch clean process. The touch clean process can include wet chemical processing in a dilute solution of de-ionized water and hydrofluoric acid (HF) and in the ratio of, for example, 1000:1. Alternatively, the wall heights of isolated insulating columns 111 can be preferentially lowered using a CMP process by taking advantage of the polish rate difference described above with reference to FIGS. 2A and 2B. Using this method, at 216, the array of insulating columns is polished for a fixed process time t. Preferential lowering of the isolated wall heights during the polishing step is made possible by the underlying local topography that is known from FIG. 2A to govern the polish rate. As a result, the insulating columns 111 on top of the steps (A) polishes faster than the insulating material below the steps (B) or over the non-isolated insulating columns 114 (B) where there is no step.

It is noted that the process used at 216 is targeted to produce a resulting height difference 115 that permits, above the isolated insulating columns 111, formation of horizontal antifuse locations having a geometry that corresponds to a desired breakdown voltage of the capacitive antifuse.

Figure 4B:
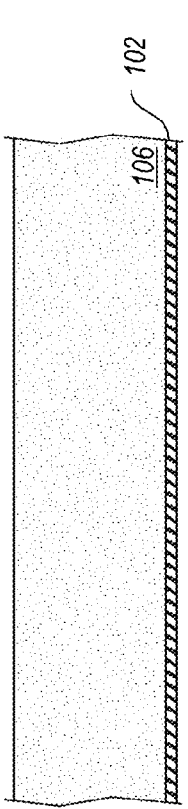
FIGS. 4B-4D are cross-sectional views of profiles formed by each of the process steps shown FIG. 4A.
Figure 4C:
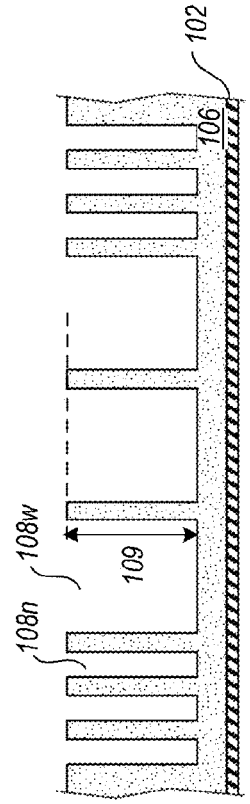
Figure 4D:
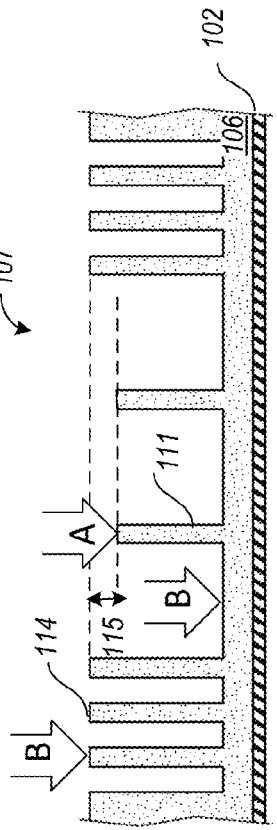
Figure 4A:
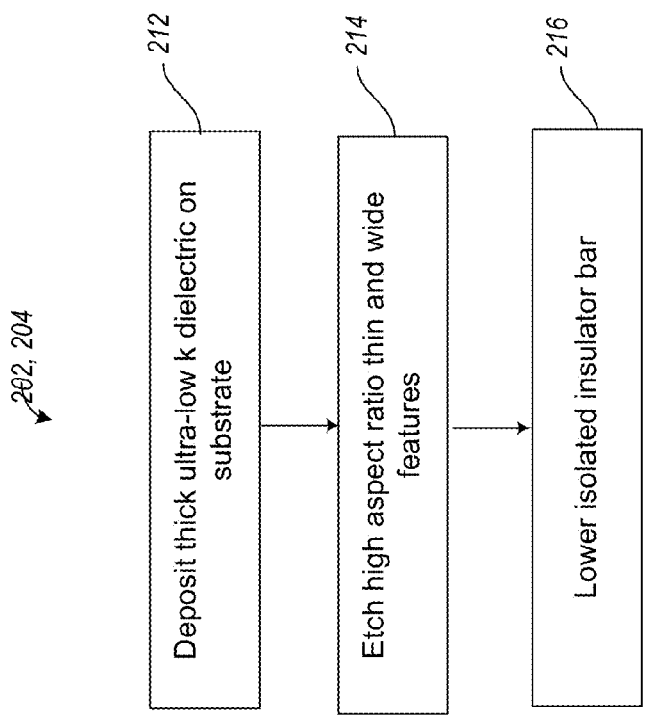
FIG. 4A is a detailed process flow diagram showing a sequence of process steps that can be used to pattern an array of trenches that present a non-uniform surface topography.

It is also noted that lowering the isolated insulating columns 111 creates a local step height difference 115 as described above with reference to FIG. 2A. This non-uniform topography as established in FIG. 4D permits the rest of the method 200 to proceed without a need for subsequent mask layers following 216. Instead, all subsequent processing entails only deposition and polishing steps in which differential polish rates are used to produce different film thicknesses in different areas. Because each photoresist mask layer entails many steps, including creating a reticle, spinning, exposing, developing, and curing the photoresist mask, performing registration to align the mask to the underlying layer, etching the pattern, and removing the mask, each mask layer that is avoided represents a significant cost saving.

FIGS. 5A-7C show and describe the process step 206 in further detail. With reference to FIG. 5A, an exemplary sequence of operations is used to fill the narrow trenches 108*n* and to form part of the capacitive antifuse in the central region of the wide trenches 108*w*.

At 230, a thin metal liner 117 is conformally deposited over the integrated electronic structure 107. In one embodiment, the thin metal liner 117 is a bi-layer in which the lower layer is made of titanium (Ti) and the upper layer can be made of, for example, titanium (Ti), titanium nitride (TiN) or tantalum nitride (TaN), depending on the choice of bulk metal material. For example, a bi-layer having an upper layer of TaN is commonly used with copper interconnects. The lower Ti layer provides good adhesion to the underlying ULK dielectric material, while the TaN provides a barrier between the ULK material and the bulk metal trench fill material to be deposited next, that prevents contamination from the bulk metal. The total thickness of the thin metal liner 117 is in the range of about 1-8 nm.

At 232, a first layer of is formed so as to slightly overfill the narrow trenches 108*n* while partially filling the wide trenches 108*w*. The bulk metal 119 in the embodiment shown is desirably a metal suitable for use as a nanowire interconnect material. Such metals include, for example, copper, gold, silver, titanium, aluminum, tungsten, platinum, tantalum, or combinations thereof. Combinations of such metals include layered metal stacks or alloys. The bulk metal 119 tends to fill up the narrow trenches 108*n* first resulting in an over-fill, while the wide features 108*w* remain only partially filled. Thus, the trenches, after metal deposition, exhibit an irregular surface. Thus, the tallest portions of the irregular surface correspond to the patterned regions having the narrowest features, and the shortest areas of the irregular surface correspond to the patterned areas having the widest features. The trench fill process can be a plasma deposition process such as chemical vapor deposition (CVD) or plasma vapor deposition (PVD). Alternatively, the trench fill process can be a plating process such as electroplating or electro-less plating. In one embodiment, the first layer of bulk metal 119 is deposited by a combination of plasma vapor deposition (PVD) and partial electroplating. However, any deposition method can be used to achieve a final profile that provides about 80 nm of metal thickness above the arrays of thin wires 112.

Figure 6B:
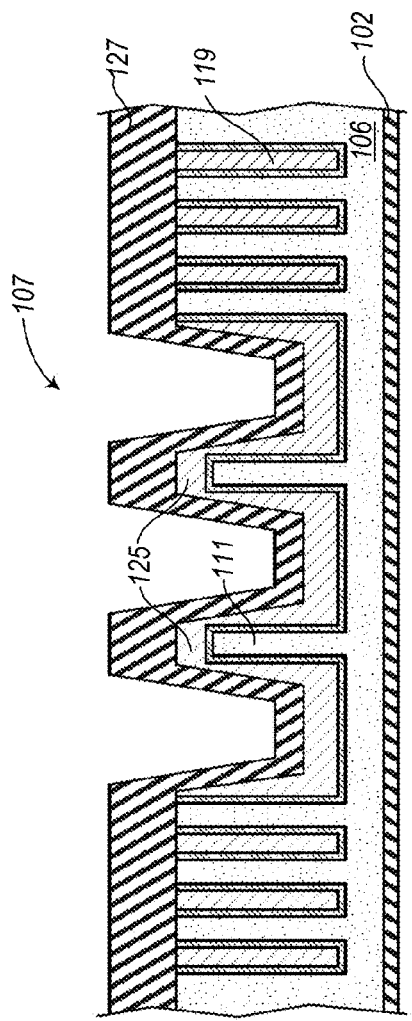
FIGS. 6B-6C are cross-sectional views of profiles formed by each of the process steps shown FIG. 6A.
Figure 6C:
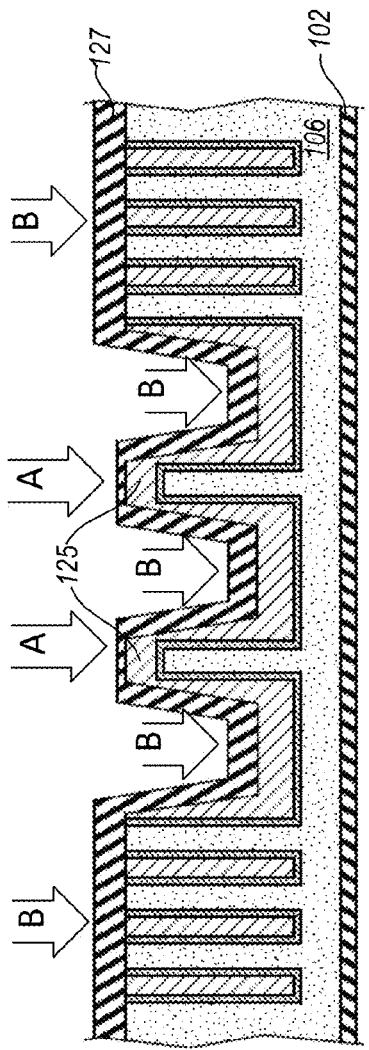

The deposition process of the bulk metal 119 is preferably conformal, however, because of the variations in the depths of the trenches and the disparity in height between adjacent features, the deposition may not be fully conformal, and may be thicker on bottom surfaces than on side surfaces, as shown in FIGS. 6C and 6D. This may result in further emphasizing the differences in height of the various surface features, further increasing the unevenness and irregularity of the uppermost surface.

By depositing the bulk metal 119, an array of thin wires 112 is formed on either side of the central wide trench region. At the same time, vertical capacitor plates 123 are formed on either side of each isolated insulating column 111. At the same time, the bulk metal 119 forms a vertical serpentine resistor. Serpentine resistors thus formed at, for example, a 48-nm pitch, and a length of about 0.8 m can withstand current densities of about 60 Ohms/μm. The highest current density that the serpentine resistors can sustain depends on factors such as the purity of the metals used, and the alloy type.

At 234, a—touch CMP operation is performed to remove bulk metal above the arrays of thin wires 112, stopping on the ULK dielectric block 106. Removing this excess metal electrically isolates the arrays of thin wires 112 from each other and the capacitor plates formed by the first layer of bulk metal 119. The touch CMP process leaves behind thin metal caps 125 on top of the isolated insulating columns 111. The height of the thin metal caps 125 may be generally planar with the height of the arrays of thin wires 112, in one embodiment. Generally, the CMP will have little to no effect on these metal caps 125, since the metal caps 125 are already lower than the bulk metal 119 over the arrays of thin wires 112. Alternatively, depending on the chemistry of the slurry during the CMP of the bulk metal 119, the metal caps 125 might be etched somewhat to be lower than the planar top surfaces of the arrays of thin wires 112.

Figure 6A:
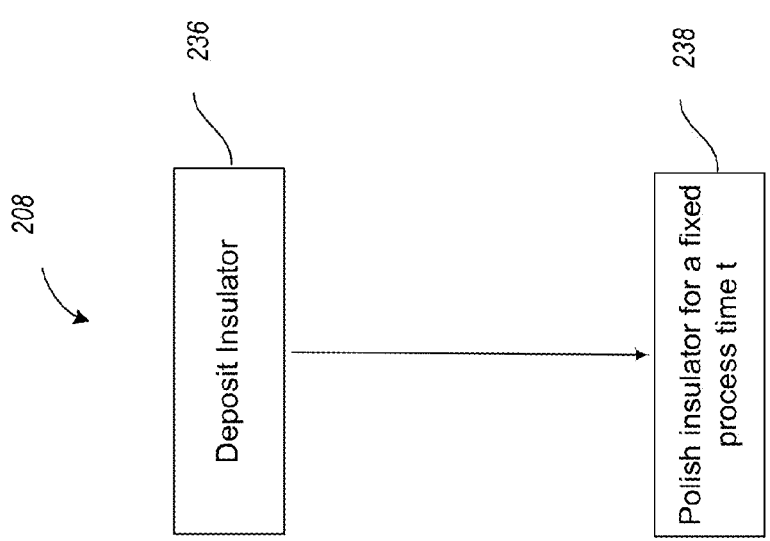
FIG. 6A is a detailed process flow diagram showing a sequence of process steps that can be used to create partial horizontal and vertical parallel plate capacitors in a dielectric block.

FIGS. 6A-6C show and describe processing operations in the step 208.

At 236, an insulating layer 127 is conformally deposited over the integrated electronic structure 107. The insulating layer 127 can be, for example, $SiC_xN_y$, or a ULK oxide layer. The insulating layer 127 has a target thickness within the range of about 100-200 nm. Other insulating silicon nitride compositions can also be used, as well as other insulating materials that deposit substantially conformally. It is noted that it is the insulating layer 127, not the isolated insulating columns 111, that forms the capacitive dielectrics for the vertical antifuses.

At 238, the dielectric layer 101 is polished for a fixed process time t to thin the capacitive dielectric preferentially on top of the isolated insulating columns 111. This preferential thinning is made possible by the underlying local topography that is known from FIG. 2A to govern the polish rate. As a result, the insulator film on top of the steps (A) polishes faster than below the steps (B) or over the arrays of thin wires 112 (B) where there is no step. The resulting thin dielectric on top of the steps (A) will form horizontal parallel plate capacitors having a different dielectric thickness d, and therefore a different capacitance $C=\in A/d$, from that of the vertical parallel plate capacitors. The CMP fixed process time t is targeted to achieve a desired thickness of the insulator film at A above the thin metal caps 125, so as to yield capacitive antifuses having a breakdown voltage within the range of about 5-6 V. Alternatively, the CMP can be carried out for a longer time to result in a lower breakdown voltage such as under 4 V, or for a shorter time to result in a higher breakdown voltage exceeding, for example, 8V.

Figure 7B:
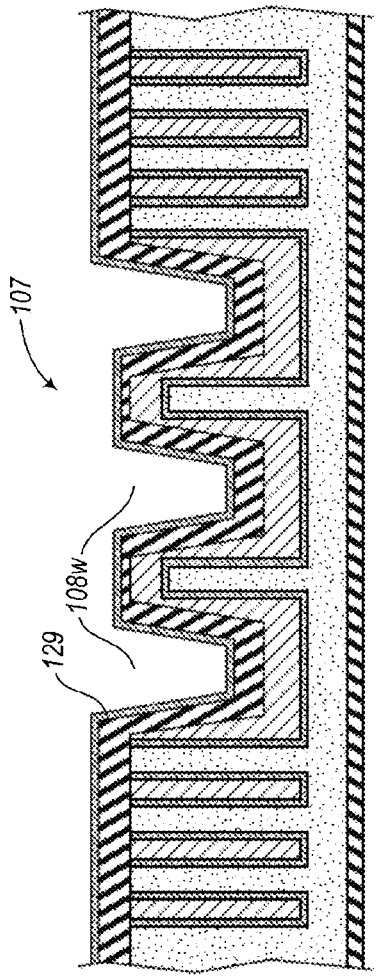
FIGS. 7B-7C are cross-sectional views of profiles formed by each of the process steps shown FIG. 7A.
Figure 7C:
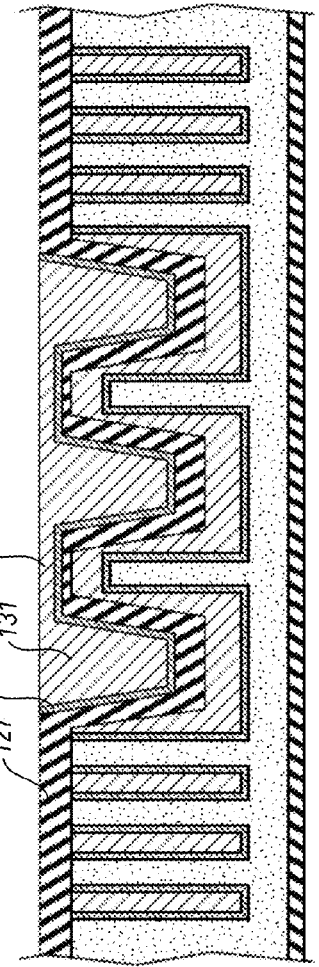
Figure 7A:
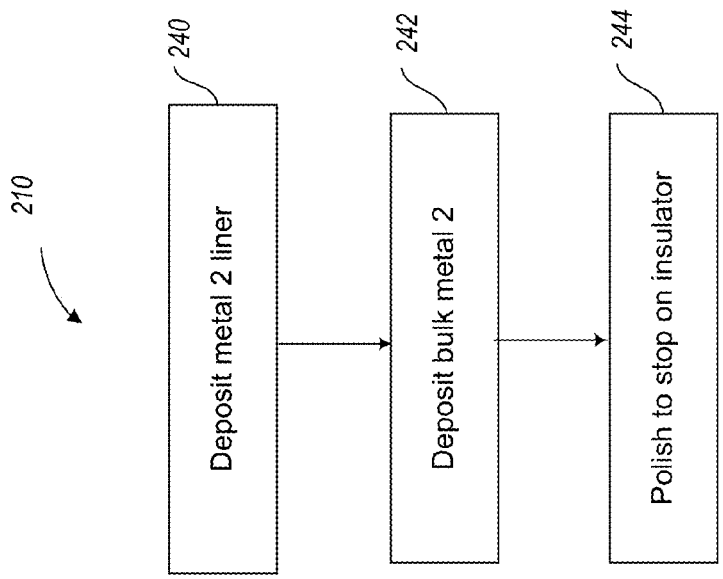
FIG. 7A is a detailed process flow diagram showing a sequence of process steps that can be used to complete formation of horizontal and vertical parallel plate capacitors in a dielectric block.

FIGS. 7A-7C show and describe further processing operations in the step 210 to form a completed integrated electronic structure 107 as shown in FIG. 9.

At 240, a second metal liner 129 is conformally deposited over the integrated electronic structure 107.

At 242, the wide trenches 108w are filled with a second bulk metal layer 131.

At 244, the second bulk metal layer 131 and the second metal liner 129 are polished to stop on the insulator 127. Due to the preferential thinning of the insulator 127 at 238, polishing the second bulk metal layer 131 leaves behind metal regions 133 and the lower height walls 111 between the wide trenches 108w.

Figure 8:
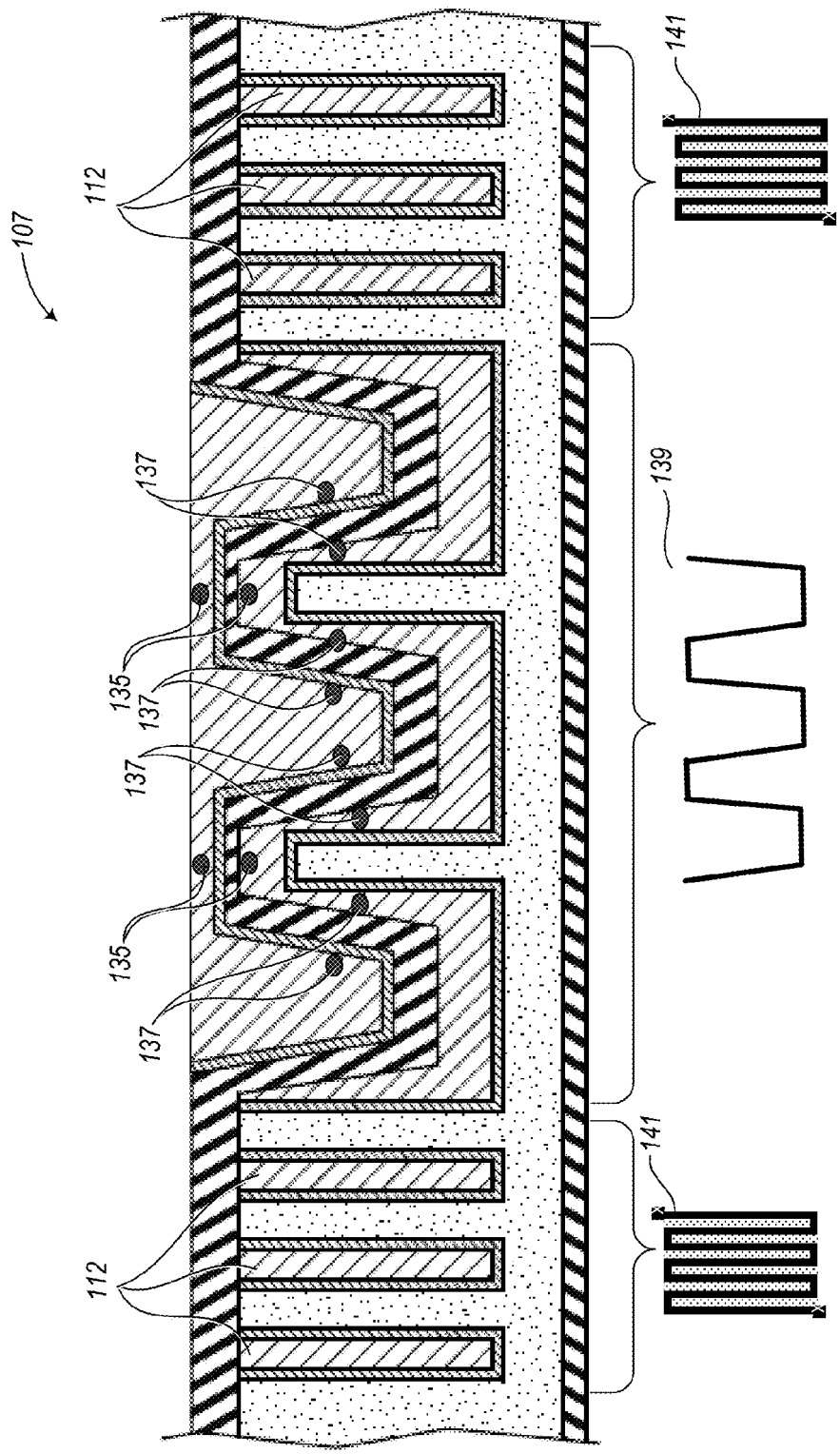
FIG. 8 is a cross-sectional view of a completed integrated electronic structure that contains three serpentine resistors suitable for use as microelectronic fuses, and six parallel plate capacitors suitable for use as microelectronic antifuses, according to one embodiment.

With reference to FIG. 8, the completed integrated electronic structure 107 simultaneously provides a serpentine-shaped parallel plate capacitor suitable for use as a plurality of microelectronic antifuses, and three serpentine resistors suitable for use as microelectronic fuses. Other examples can be made having different arrangements or numbers of resistors and capacitors. In the present example, the metal regions 133 and the thin metal caps 125 form plates of horizontal parallel plate capacitors 135. The two plates of one such horizontal parallel plate capacitor antifuse 135 are indicated in FIG. 8 by vertically aligned dots 135. The metal in the wide trenches 108w and the first layer of bulk metal 119 also form plates of vertical parallel plate capacitor antifuses 137. The plates of four such vertical parallel plate capacitor antifuses 137 are indicated in FIG. 9 by horizontally aligned dots 137. Meanwhile, the first layer of bulk metal 119 by itself forms a vertical serpentine resistor 139. Additionally, each array of thin wires 112 forms a horizontal serpentine resistor 141. The terms vertical and horizontal are relative to the plane of the semiconductor substrate 102, which is considered to be a horizontal plane.

It is noted that the integrated electronic structure 107 provides a total of nine circuit elements in a remarkably compact volume. It is further emphasized that the integrated electronic structure 107 is achieved as described above by using only one or two lithography mask steps, to create the trench configuration shown in FIG. 5D. Thereafter, all the processing is done using only deposition and planarization steps, taking advantage of differential polish rates that depend on topography. The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated electronic structure comprising:
   a semiconductor substrate extending in a first plane;
   a pair of metal serpentine structures in a vertical orientation orthogonal to the first plane of the substrate; and
   a dielectric separating the pair of metal serpentine structures,
   the integrated electronic structure forming:
      a vertical serpentine resistor;
      a plurality of horizontal parallel plate capacitors; and
      a plurality of generally vertical parallel plate capacitors.

2. The integrated electronic structure of claim 1 wherein the dielectric is a composite of more than one dielectric material.

3. The integrated electronic structure of claim 1 wherein the dielectric includes an ultra-low-k dielectric material.

4. The integrated electronic structure of claim 1, further comprising one or more planar metal arrays incorporated into the dielectric, each planar metal array including links that form a horizontal metal serpentine resistor.

5. The integrated electronic structure of claim 4 wherein one or more of the serpentine resistors is configured as an electrical fuse coupled to a circuit integrated into the planar semiconductor substrate.

6. An integrated electronic structure, comprising:
   a semiconductor substrate extending in a first plane;
   a pair of metal serpentine structures in a vertical orientation orthogonal to the first plane of the substrate; and
   a dielectric separating the pair of metal serpentine structures,
   the integrated electronic structure forming:
      a vertical serpentine resistor;
      a plurality of horizontal parallel plate capacitors; and,
      a plurality of generally vertical parallel plate capacitors, wherein one or more of the parallel plate capacitors being configured as an electrical antifuse coupled to a circuit integrated into the planar semiconductor substrate.

7. A set of integrated circuit elements formed on a semiconductor substrate, the set of integrated circuit elements comprising:
   a plurality of vertical and horizontal serpentine resistors, each made of the same material; and
   a plurality of vertical and horizontal parallel plate capacitors, at least one plate in each capacitor of the plurality being made of the same material as the serpentine resistors.

8. The set of integrated circuit elements according to claim 7 wherein the parallel plate capacitors include an ultra-low-k dielectric having a dielectric constant in the range of about 2.0-3.0.

9. The set of integrated circuit elements according to claim 7 wherein the resistors and capacitors include a bulk metal made of at least one of copper, gold, silver, titanium, aluminum, tungsten, platinum, or combinations thereof.

10. The set of integrated circuit elements according to claim 9 wherein the bulk metal is formed adjacent to a metal liner made of at least one of titanium, titanium nitride, tantalum nitride, or combinations thereof.

11. The set of integrated circuit elements according to claim 7, including three serpentine resistors and six parallel plate capacitors.

12. A set of integrated circuit elements formed on a semiconductor substrate, the set of integrated circuit elements comprising:
   a plurality of vertical and horizontal serpentine resistors, each made of the same material, the serpentine resistors being suitable for use as microelectronic resistive fuses that sustain current densities up to about 60 Ohms/micron; and
   a plurality of vertical and horizontal parallel plate capacitors, at least one plate in each capacitor of the plurality being made of the same material as the serpentine resistors.

13. A set of integrated circuit elements formed on a semiconductor substrate, the set of integrated circuit elements comprising:
   a plurality of vertical and horizontal serpentine resistors, each made of the same material; and
   a plurality of vertical and horizontal parallel plate capacitors, at least one plate in each capacitor of the plurality being made of the same material as the serpentine resistors, the parallel plate capacitors being suitable for use as microelectronic capacitive antifuses that sustain voltages up to at least 5V.

* * * * *